US012804913B2

(12) United States Patent
Lallemand et al.

(10) Patent No.: US 12,804,913 B2
(45) Date of Patent: Nov. 17, 2026

(54) INTEGRATED DEVICE HAVING PLUGGED UP PORES IN AN ISLAND OR A PROTUBERANCE, AND CORRESPONDING METHOD

(71) Applicant: Murata Manufacturing Co., Ltd., Nagaokakyo (JP)

(72) Inventors: Florent Lallemand, Herouville Saint-Clair (FR); François Le Cornec, Caen (FR); Maxime Lemenager, Caen (FR); Florent Tanay, Carpiquet (FR)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 342 days.

(21) Appl. No.: 18/614,450

(22) Filed: Mar. 22, 2024

(65) Prior Publication Data

US 2024/0321946 A1 Sep. 26, 2024

(30) Foreign Application Priority Data

Mar. 23, 2023 (EP) .................................... 23305392

(51) Int. Cl.
*H10D 1/00* (2025.01)
*H10D 1/68* (2025.01)
(Continued)

(52) U.S. Cl.
CPC ............. *H10D 1/042* (2025.01); *H10D 1/043* (2025.01); *H10D 1/716* (2025.01);
(Continued)

(58) Field of Classification Search
CPC ........ H10D 1/042; H10D 1/043; H10D 1/716; H10D 1/712; H10W 72/952;
(Continued)

(56) References Cited

U.S. PATENT DOCUMENTS

| | | | | |
|---|---|---|---|---|
| 2016/0268144 | A1* | 9/2016 | Voiron | H10D 1/692 |
| 2021/0066449 | A1* | 3/2021 | Voiron | C25D 11/022 |
| 2021/0074477 | A1* | 3/2021 | Oukassi | H01G 11/70 |

FOREIGN PATENT DOCUMENTS

| | | | |
|---|---|---|---|
| EP | 3567645 | A1 | 11/2019 |
| EP | 3929981 | A1 | 12/2021 |

(Continued)

OTHER PUBLICATIONS

European Search Report dated Aug. 16, 2023 from corresponding EP Application No. 23305392.5-1212.

*Primary Examiner* — Didarul A Mazumder
(74) *Attorney, Agent, or Firm* — ArentFox Schiff LLP

(57) ABSTRACT

An integrated device that includes: a substrate; a metal barrier layer above the substrate; a layer including a porous region of anodized metal having a plurality of substantially straight pores that extend from a top surface of the porous region, perpendicularly to the top surface of the porous region, towards the metal barrier layer so as to reach the metal barrier layer, wherein the porous region includes a zone of pores that open onto the metal barrier layer surrounded by peripheral pores that are plugged up at their bottom ends by an oxide plug of the metal barrier, and the porous region further includes: an island of pores plugged up at their bottom end by an oxide plug of the metal barrier, and/or a protuberance of pores plugged up at their bottom end by an oxide plug of the metal barrier.

14 Claims, 5 Drawing Sheets

(51) Int. Cl.
*H10W 72/20* (2026.01)
*H10W 72/29* (2026.01)
*H10W 72/90* (2026.01)

(52) U.S. Cl.
CPC ........ *H10W 72/242* (2026.01); *H10W 72/252* (2026.01); *H10W 72/29* (2026.01); *H10W 72/952* (2026.01)

(58) Field of Classification Search
CPC ............. H10W 72/252; H10W 72/242; H10W 20/496; H10W 72/29; H10W 44/601; C25D 11/022; C25D 11/18; C25D 11/26; H10P 14/6314; H10P 14/6324; H01G 4/012; H01G 4/10; H01G 4/33; H01G 4/385; H01G 4/1254
USPC .................. 257/534; 438/255, 398, 665, 964
See application file for complete search history.

(56) References Cited

FOREIGN PATENT DOCUMENTS

| | | | |
|---|---|---|---|
| WO | 2007125510 | A2 | 11/2007 |
| WO | 2015063420 | A1 | 5/2015 |
| WO | 2019/202046 | A1 | 10/2019 |

* cited by examiner

INTEGRATED DEVICE HAVING PLUGGED UP PORES IN AN ISLAND OR A PROTUBERANCE, AND CORRESPONDING METHOD

CROSS REFERENCE TO RELATED APPLICATIONS

The present application claims priority to European Patent Application No. EP23305392, filed Mar. 23, 2023, the entire contents of which is incorporated herein by reference.

FIELD OF THE DISCLOSURE

The present disclosure relates to the field of integration and, more particularly, to electrical devices, related semiconductor products, and their methods of manufacture.

TECHNICAL BACKGROUND

Electronic components such as capacitors may be integrated into semiconductor products in a variety of forms. For example, planar capacitors may be formed above semiconductor substrates by forming two planar electrodes separated by a dielectric layer. However planar capacitors provide low capacitance density, this implies that a high value capacitance will consume a significant area of silicon.

To overcome this issue, it has been proposed to form three-dimensional structures to increase the capacitance of capacitors. Capacitance densities of the order of a Farad per $m^2$ have been achieved using three-dimensional (3D) capacitors.

A 3D capacitor comprises functional electrodes presenting a relief (for example they comprise a surface presenting a relief or they are formed on a relief such as a pore, a hole, a trench, or a pillar). Typically, it is possible to form a conductive 3D structure by using Deep Reactive Ion Etching, followed by subsequent deposition steps of a dielectric and of a conductive material to form a capacitor. Document WO 2007125510 discloses a method for forming such a 3D capacitor.

It has also been proposed to form capacitors inside of a porous insulating structure formed by anodizing a conductive layer, such a structure being disclosed in document WO 2015/063420.

It has been observed that in some components that include anodic porous oxide, entire porous regions can delaminate. This lowers the manufacturing yield of devices that include anodized porous region.

No solution to this problem has been found in the prior art.

The present disclosure has been made in the light of the above problems.

SUMMARY OF THE DISCLOSURE

The present disclosure provides an integrated device comprising: a substrate; a metal barrier layer above the substrate; a layer including a porous region of anodized metal comprising a plurality of substantially straight pores that extend from a top surface of the porous region, perpendicularly to the top surface of the porous region, towards the metal barrier layer so as to reach the metal barrier layer, wherein the porous region comprises a zone of pores that open onto the metal barrier layer surrounded by peripheral pores that are plugged up at their bottom ends by an oxide plug of the metal barrier, the porous region further comprising: an island of pores (a plurality of pores that, taken together, have the shape of an island) plugged up at their bottom end by an oxide plug of the metal barrier surrounded by pores of the zone of pores that open onto the metal barrier layer, and/or a protuberance of pores (a plurality of pores that, taken together, have the shape of a protuberance) plugged up at their bottom end by an oxide plug of the metal barrier, the protuberance extending from the peripheral pores towards the inside of the zone of pores that open onto the metal barrier layer.

In this device, the pores that reach the metal barrier layer are divided into two fractions, pores that are plugged at their bottom ends by an oxide of the metal of the metal barrier (the peripheral pores, the island and/or the protuberance) and the other pores of the zone of pores that open onto the metal barrier layer, for example etched at their bottom ends so as to open onto the metal barrier.

When the porous region includes an island, this island can be observed from the top of the device, with the pores that are not plugged up of the zone of pores surrounding laterally the island. Multiple islands can be present within the same zone of pores.

When the porous region includes a protuberance, this protuberance extends in the plane of the device. In other words, when the device is observed from the top, the porous region comprises plugged-up pores that extend from the peripheral pores (that define an edge of the zone of pores and which are also plugged-up) towards the inside of the zone of pores (away from the edge of the zone of pores) in the shape of a protuberance. Multiple protuberances can be present, so as to obtain a corrugated edge for the zone of pores that open onto the metal barrier layer.

The above device has been observed to limit the appearance of defects such as delamination.

In the above device, the substrate can comprise a stack of different materials, for example a semiconductor layer (typically a silicon or glass wafer) and a conductive layer (for example including the anodizable material). In this arrangement, the conductive layer can be the top layer in the substrate, for example in contact with the metal barrier layer.

As a metal barrier is used to prevent anodization of the underlying substrate (which may include anodizable material), the anodization process creates an oxide of the material of the barrier layer at the bottom ends of the pores, which may subsequently prevent the anodization fluid and the pores from progressing into the underlying substrate. As it may be desirable to have components formed in the porous region that form conductive structures that extend inside the pores and are electrically connected to the barrier layer, the oxide plug at the bottom of the pores is usually removed in an etching step. This etching step is performed by means of an etching mask (sometimes referred to as a hard mask) that delimits the components in the porous region. It should be noted that the porous region comprises pores that open onto the metal barrier layer, to allow forming a component electrically connected to the barrier layer.

The etching mask is typically used to delimit where the final component/device will be accommodated inside the pores, in a manner known from the prior art as described in document EP 3567645. In fact, the etching mask can delimit the zone of pores that open onto the metal barrier layer.

The inventors of the present disclosure have observed that when this etching mask covers a certain quantity of pores, located in an island within the zone of pores and/or in a protuberance at an edge typically a quantity greater than the quantity of pores covered in the periphery of an opening as was performed in the solutions of prior art document EP 3567645 (in which the etching mask is called a hard mask and is designated using reference 514), the anodic porous oxide region does not delaminate.

This improvement, relating to the prevention of delamination, results from the presence of oxide plugs at the bottom of pores under the etching mask (if the etching mask remains present after etching), even after an etching step has been performed, the oxide plugs acting as anchoring points between the anodic porous oxide and the metal barrier layer.

The person skilled in the art will be able to select the materials of the metal barrier layer and of the metal to be anodized so as to form the straight pores. Also, the anodization mask has a material to be selected so as not to be affected when the bottom ends of the pores are etched.

Etching the bottom ends of the pores can comprise reaching the metal barrier layer, for example by removing an oxide plug.

According to a particular embodiment, pores that are plugged up at their bottom end are covered by an etching mask having an opening above the zone of pores that open onto the metal barrier layer.

For example, the etching mask can be present above a subset or over all the pores that are plugged up at their bottom end by an oxide of the metal barrier layer.

According to a particular embodiment, the etching mask includes, at the periphery of the opening, at least one etching mask protuberance in the direction of the inside of the opening, the etching mask protuberance mask covering a protuberance of pores that are plugged up at their bottom end.

Here, it is the etching mask which delimits the protuberance of pores that are plugged-up.

A plurality of etching mask protuberances is preferable, for example to form corrugated edges for the etching mask.

These etching mask protuberances also provide planar surfaces, remotely from the edges of the anodic porous oxide region exhibits a particular topology (the anodic porous oxide region is thicker than the initial anodizable metal). By means of these planar surfaces, it is possible to accommodate elements such as copper pillars or solder bumps, that benefit from these planar surfaces (in terms of reliability, facilitating placement of the components, etc.).

According to a particular embodiment, the device comprises a plurality of said protuberances of pores (potentially also a plurality of etching mask protuberances), and wherein a group of protuberances of the plurality of protuberances are evenly spaced (for example along a same edge (of the peripheral pores/of the zone of pores that open onto the metal barrier layer), preferably along opposite edges, even more preferably along all the edges of the opening).

This allows obtaining corrugated edge or corrugated edges, which limit the delamination.

These regular/evenly spaced protuberances, when covered by an etching mask protuberance, can accommodate a plurality of elements such as copper pillars or solder bumps (one per salient portion).According to a particular embodiment, at least one etching mask protuberance is lobe-shaped.

This shape has been observed to be well adapted to receive a copper pillar or a solder bump above the etching mask protuberance.

According to a particular embodiment, the at least one etching mask protuberance extends from an edge of the zone of pores that open onto the metal barrier layer over a distance of about 50 μm towards the inside of the opening.

These dimensions are appropriate to receive a copper pillar or a solder bump above the etching mask protuberance.

According to a particular embodiment, the device comprises, above an etching mask protuberance, a copper pillar or a solder bump.

According to a particular embodiment, the device comprises a stacked capacitive structure including a bottom electrode layer, a dielectric layer, and a top electrode layer inside pores of the porous region (for example at least the pores of the zone of pores that open onto the metal barrier layer, for example the pores accessible through the opening of the etching mask).

This particular embodiment comprises forming a capacitor of the integrated device. Forming the capacitor may be performed after an etching step (of the bottom ends of the pores of the zone of pores) has been performed and before a subsequent dicing step.

The disclosure is not limited to integrated device comprising capacitors, other components can be formed in the device region such as resistors, inductors, sensors, etc.

According to a particular embodiment, the porous region comprises an island of pores plugged up at their bottom end by an oxide plug of the metal barrier surrounded by pores of the zone of pores that open onto the metal barrier layer, covered by an etching mask island.

For example, the etching mask island can be part of the etching mask mentioned above.

According to a particular embodiment, the porous region comprises a plurality of islands of pores plugged up at their bottom end by an oxide plug of the metal barrier surrounded by pores of the zone of pores that open onto the metal barrier layer (and possibly a plurality of etching mask islands).

By way of example, the plurality of islands can be located at the vertexes of a tiling of regular polygons, typically a tiling of regular hexagons.

The dimensions of an island can be determined in accordance with the specifications of the photolithography step used to pattern the etching mask. For example, the islands can have dimensions of the order of a micrometer.

The dimensions of the islands being set in accordance with their impact on the components (as they impact the capacitance of capacitors that cannot extend inside the pores covered by an etching mask island).

According to a particular embodiment, the etching mask island is substantially round (when observed from the top, for example as round as a photography step can achieve).

This roundness, in a manner which is analogous to the lobe-shaped protuberances described above, can accommodate a copper pillar or a solder bump.

According to a particular embodiment, the device comprises, above the substantially round island, a copper pillar or a solder bump.

According to a particular embodiment, the porous region further comprises a bridge of pores plugged up at their bottom end by an oxide plug of the metal barrier, the bridge joining two edges of the porous region and separating the zone of pores that open onto the metal barrier into two sub-zones.

This bridge can further improve the prevention of delamination.

For example, the device comprises a bridge of etching mask having two openings separated by the bridge of etching mask, the bridge of pores being under the bridge of etching mask.

The disclosure also provides a method of manufacturing an integrated device comprising: forming a metal barrier layer above a substrate; forming an anodizable metal layer on the metal barrier layer; anodizing a region of the anodizable metal layer to obtain a porous region of anodized metal comprising a plurality of substantially straight pores (105) that extend from a top surface of the porous region, perpendicularly to the top surface of the porous region, towards the metal barrier layer; forming an etching mask having an opening above the porous region; etching the bottom ends of pores of the porous region through the opening of the etching mask, so that after etching, the porous region comprises a zone of pores that open onto the metal barrier layer surrounded by peripheral pores that are plugged up at their bottom ends by an oxide plug of the metal barrier, the porous region further comprising: an island of pores plugged up at their bottom end by an oxide plug of the metal barrier surrounded by pores of the zone of pores that open onto the metal barrier layer, and/or a protuberance of pores plugged up at their bottom end by an oxide plug of the metal barrier, the protuberance extending from the peripheral pores towards the inside of the zone of pores that open onto the metal barrier layer.

This method can be adapted for the manufacture of any one of the embodiments of the above defined device.

BRIEF DESCRIPTION OF THE DRAWINGS

Further features and advantages of the present disclosure will become apparent from the following description of certain embodiments thereof, given by way of illustration only, not limitation, with reference to the accompanying drawings in which.

DETAILED DESCRIPTION OF EXAMPLE EMBODIMENTS

We will now describe method for obtaining an integrated device. The present method is particularly adapted for integrated devices that include porous regions made of porous anodized metal, that accommodate components that take advantage of the very high surface area obtained on the walls of the pores such as capacitors. The disclosure is not limited to devices including capacitors as other devices can be formed inside the pores of a porous region (resistor, inductor).

Figure 1:
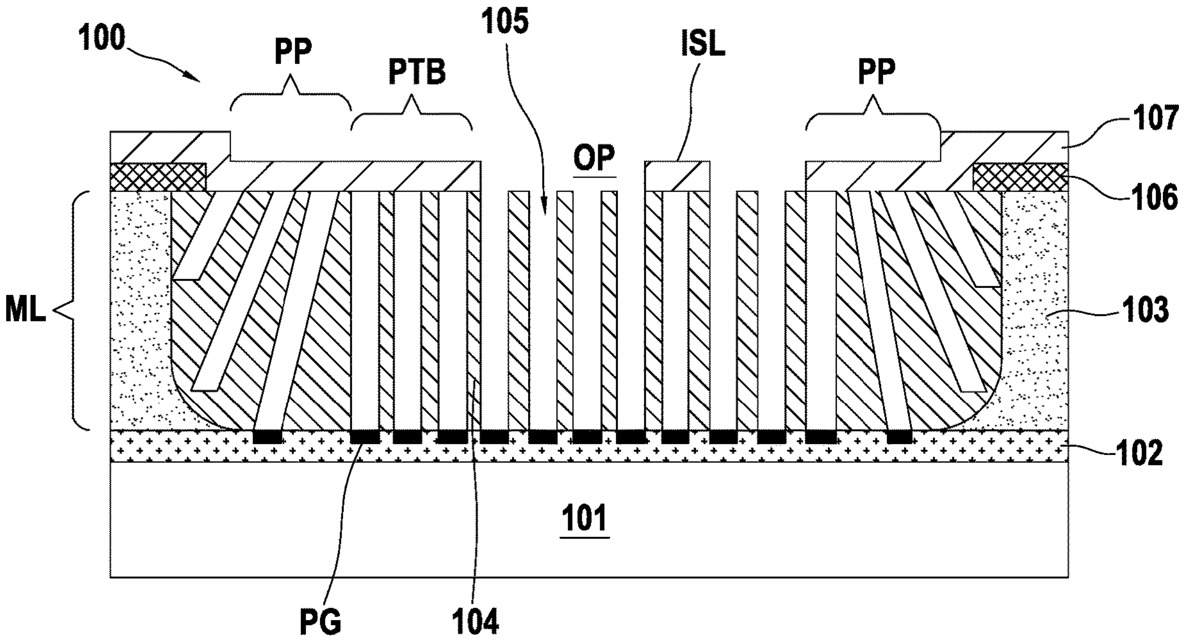
FIG. 1 is a cross-section of base structure.

FIG. 1 shows a base structure 100 from which an integrated device will be obtained.

On this figure, a substrate 101 is used to support the integrated device and is part of it. The substrate 101 can comprise a semiconductor substrate (for example a silicon substrate) or a substrate comprising glass or a polymer material. The substrate 101 may also include a conductive layer, for example comprising aluminum, for example located at the top (on the figure) of the substrate.

Above the substrate (for example above a conductive layer of the substrate), a metal barrier layer 102 has been formed. This barrier layer is an anodization barrier layer that can comprise tungsten, titanium (Ti), or tantalum (Ta).

An anodizable metal layer is formed on the metal barrier layer. The material of this anodizable metal layer is selected so as to be able to produce, during an anodization, straight pores that extend substantially perpendicularly from a surface exposed to the anodization fluid (the top surface on the figure). In the present description and by way of example, the anodizable metal layer comprises aluminum (alternatively, the anodizable metal layer may also comprise other metals such as titanium or tantalum). By way of example, the aluminum layer can have a thickness from several to tens of micrometers.

On the figure, a selective anodizing process has been performed to obtain layer ML that comprises aluminum portions 103 (portions that have not been anodized) and anodic oxide portions 104 (anodic oxide of aluminum). In the anodic oxide portions, pores 105 have been formed and these pores are substantially straight pores that extend from a top surface of the porous region, perpendicularly to the top surface of the porous region, towards the metal barrier layer.

Here, pores that reach the metal barrier layer 102 are plugged at their bottom end by an oxide plug PG comprising an oxide of the material of the metal barrier layer.

In order to obtain a selective etching, an anodization mask 106 has been formed and patterned above the anodizable metal layer, with an opening defining a porous region. Delimiting the area to be anodized can be performed by means of a hard mask/an anodization mask using the method disclosed in application WO 2019/202046.

Also, in the illustrated example, only one porous region is formed for the integrated device to be formed. Other arrangements are possible, for example by forming several porous regions separated on their sides by aluminum (unanodized metal).

Subsequently, an etching mask 107 has been deposited above the structure to cover the pores of the first porous region but with an opening OP above a portion of the second porous region. More precisely, the opening OP opens onto the middle portion of the second porous region, so as to only open onto straight pores that reach the metal barrier layer 102.

The opening OP is configured so that on the figure, a protuberance of the etching mask PTB covers a protuberance of pores that are plugged-up at their bottom end. Also, the opening OP is configured so that on the figure, within the opening, an etching mask island ISL covers an island of pores that are plugged-up at their bottom end.

It should be noted that the disclosure is not limited to the presence of both an island and a protuberance and can be implemented by means of either a protuberance or an island.

Also, the protuberance is a protuberance with respect to peripheral pores that are plugged-up and that surround the opening OP. As can be seen on the figure, there is a protuberance on the left side but not on the right side. Of course, the protuberance is better observed from the top, as will be shown in reference to FIG. 7A.

Subsequently, an etching can be performed inside the pores accessible through the opening OP, to remove the oxide plugs formed at the bottom of the pores 105 (as shown on FIG. 2, where removing the oxide plugs leaves a recess in the tungsten). For example, if a capacitor structure is formed inside the pores, the bottom electrode will be in electrical contact with the metal barrier layer because the oxide has been removed (and a conductive layer if one is present below the metal barrier layer).

Here, by means of the etching mask protuberance and of the island, the porous region comprises a zone of pores that open onto the metal barrier layer (the pores accessible through the opening OP) surrounded by peripheral pores PP that are plugged up at their bottom ends by an oxide plug of the metal barrier, and,

- an island of pores plugged up at their bottom end by an oxide plug of the metal barrier surrounded by pores of the zone of pores that open onto the metal barrier layer, below the etching mask island ISL,
- a protuberance of pores plugged up at their bottom end by an oxide plug of the metal barrier, the protuberance extending from the peripheral pores towards the inside of the zone of pores that open onto the metal barrier layer, below the etching mask protuberance PTB.

The inventors of the present disclosure have observed that the presence of oxide plugs, in the protuberance and/or in the island, increases the adhesion of porous material to a layer of metal barrier.

Figure 2:
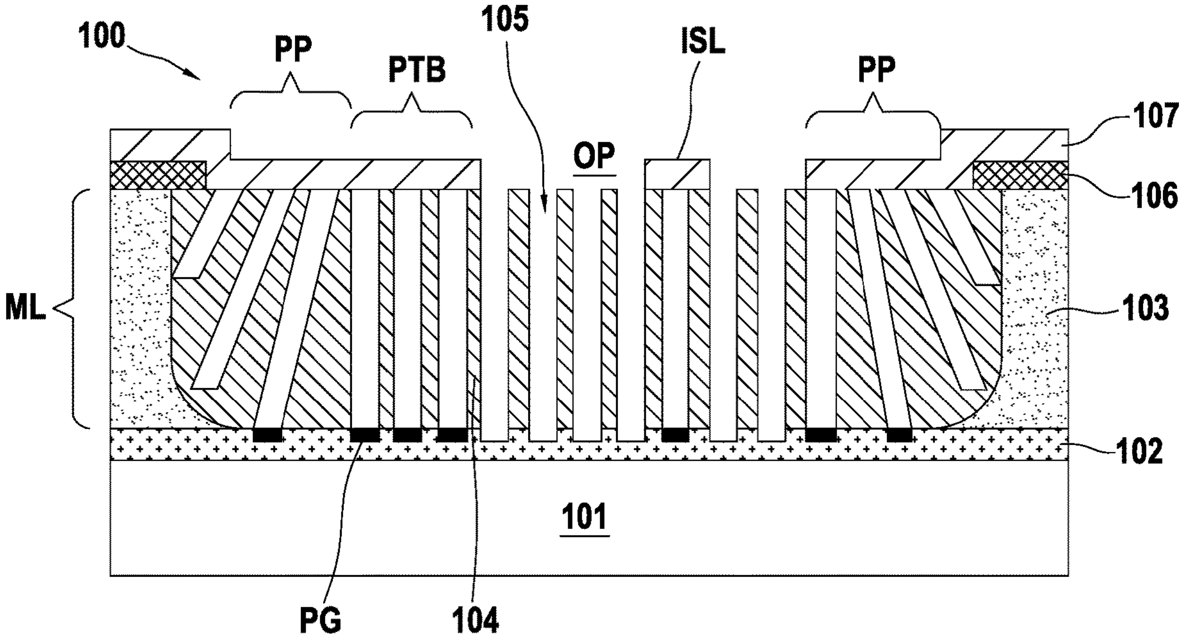
FIG. 2 is a cross-section of the base structure of FIG. 1 after an etching step has been performed
Figure 3:
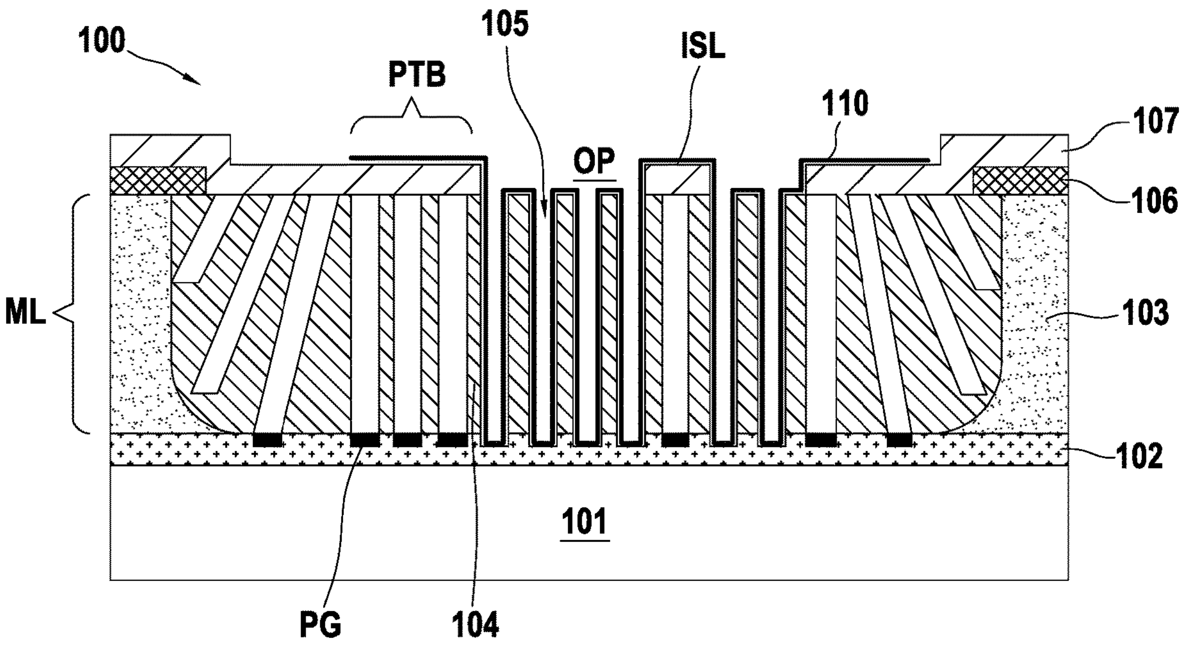
FIG. 3 is a cross-section of the structure of FIG. 2 after a capacitor has been formed.

FIG. 3 shows the structure of FIG. 2 after a capacitor 110 has been formed by depositing a stacked structure including a bottom electrode layer, a dielectric layer, and a top electrode layer inside the pores of the another porous portion accessible through the opening OP (and also above the etching mask island ISL and the etching mask protuberance PTB). Depositing the layers of the stacked structure can be performed using ALD processes, or other methods that deposit material in a conformal manner (so as to conform to the shape of the pores)

The bottom electrode of the capacitor 110 is in electrical contact with the metal barrier layer 102 as the oxide plugs have been removed.

Figure 4:
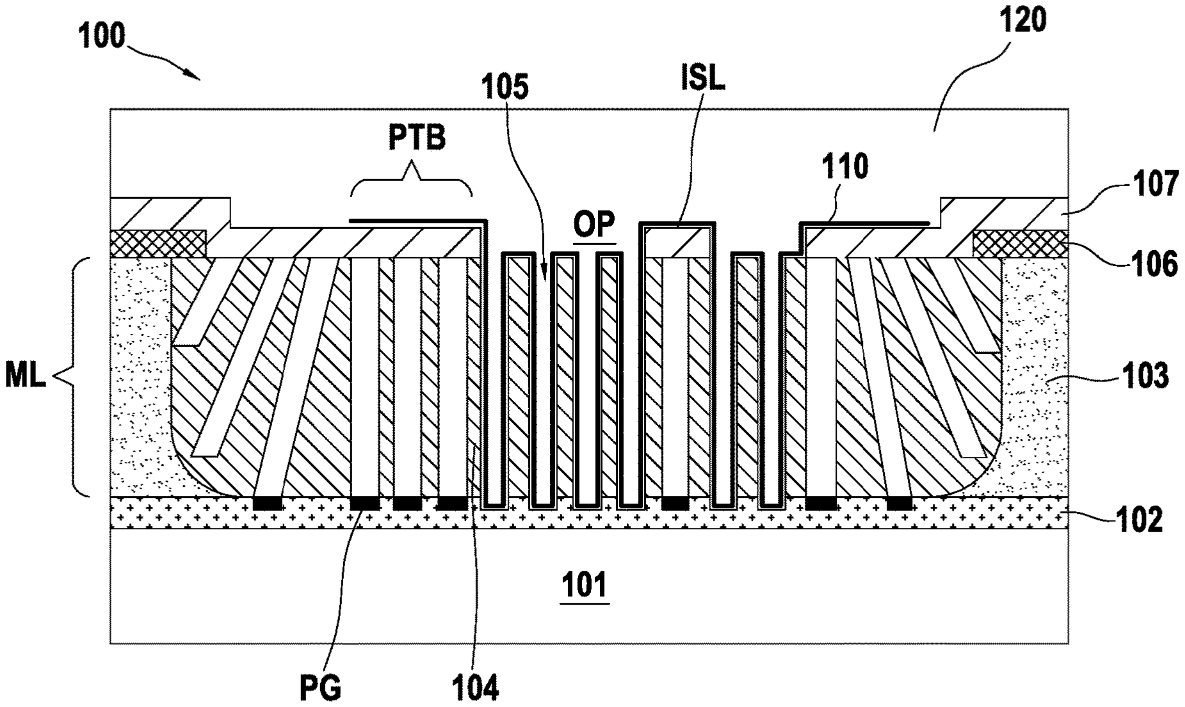
FIG. 4 is a cross-section of the structure of FIG. 3 after an insulating layer has been formed.

Above the structure obtained on FIG. 3, metallization layers and insulating layers can be deposited so as to form electrical connections to the top electrode of the capacitor 110 and to the bottom electrode (via the aluminum 103 on the sides of the device). Here, a region 120 containing metallization layers and insulating layers has been represented on FIG. 4.

Figure 5A:
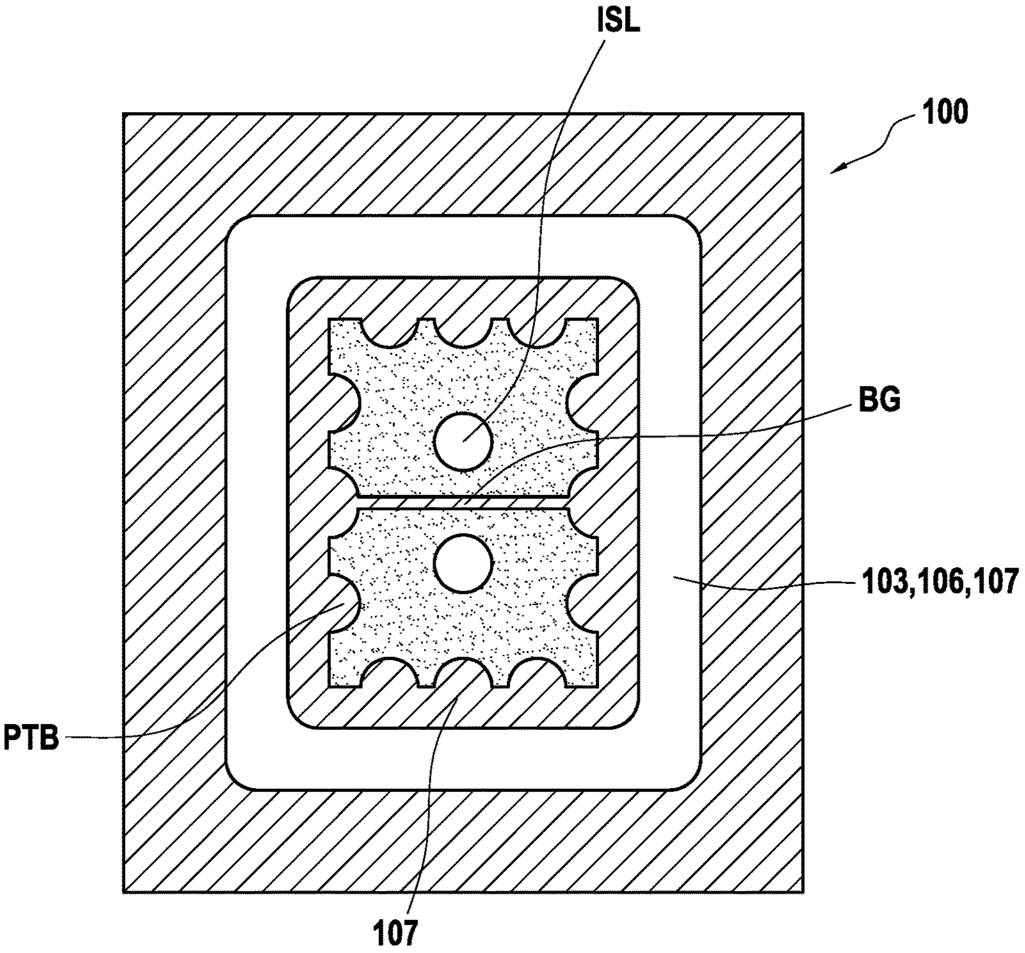
FIG. 5A is a top view of a device.

FIG. 5A shows a structure observed from the top with an integrated device 100 formed using the steps described in reference to FIGS. 1 to 4. The references used in reference to FIGS. 1 to 4 are also used on this figure to designate the same elements.

As can be observed on the figure, the etching mask islands ISL are substantially round, so as to accommodate a copper pillar or a solder bump.

Along the edges of the opening, i.e. along the edges of the peripheral pores, a series of evenly spaced lobe-shaped etching mask protuberances are arranged. These lobe-shaped protuberances are salient and prevent the delamination. They can also accommodate a copper pillar or a solder bump.

The device of this figure also includes a bridge of etching mask BG above a bridge of pores. The bridge of etching mask joins two opposite edges of etching mask and separates the zone of pores that open onto the metal barrier into two sub-zones (each having an island).

Figure 5B:
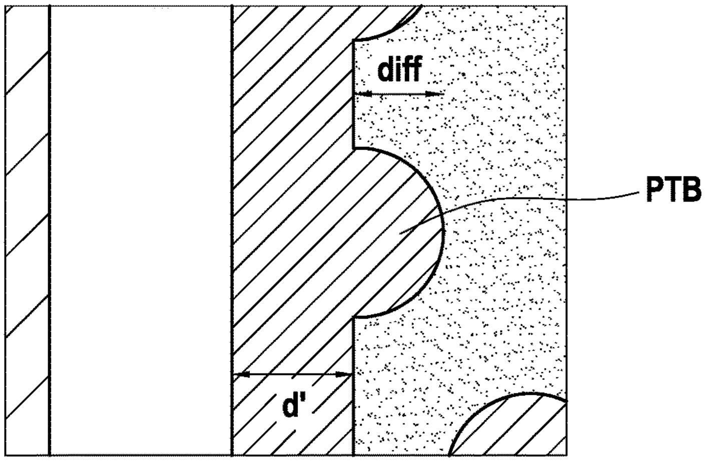
FIG. 5B is a close-up view of the device of FIG. 5A, FIGS. 5C and 5D are cross-sections of the device of FIGS. 5A and 5B.

FIG. 5B is a close up image of the structure shown on FIG. 5A and uses the same references. As can be observed on the figure, the lobe-shaped etching mask protuberance PTB extends from the edge of the anodizing mask 106 over a distance d of about 80 μm and the edge of the opening (the portion that is straight, i.e. the edge of the peripheral pores) extends from the edge of the anodizing mask 106 over a distance d' of about 30 μm. The distance diff between the edge of the opening (the straight portion) and the tip of the lobe-shaped portion is about 50 μm.

Figure 5C:
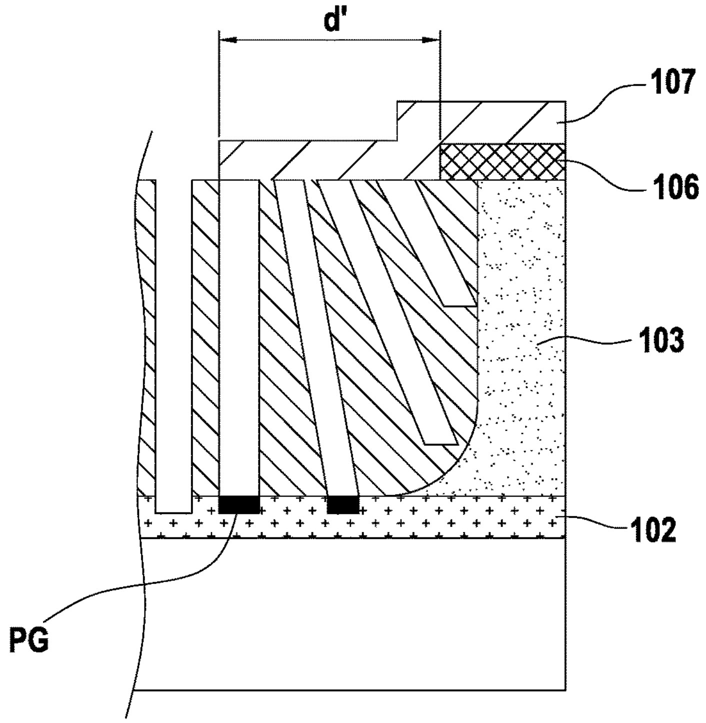

FIG. 5C is a side view of the structure of FIGS. 5A and 5B outside of the lobe-shaped portions.

Figure 5D:
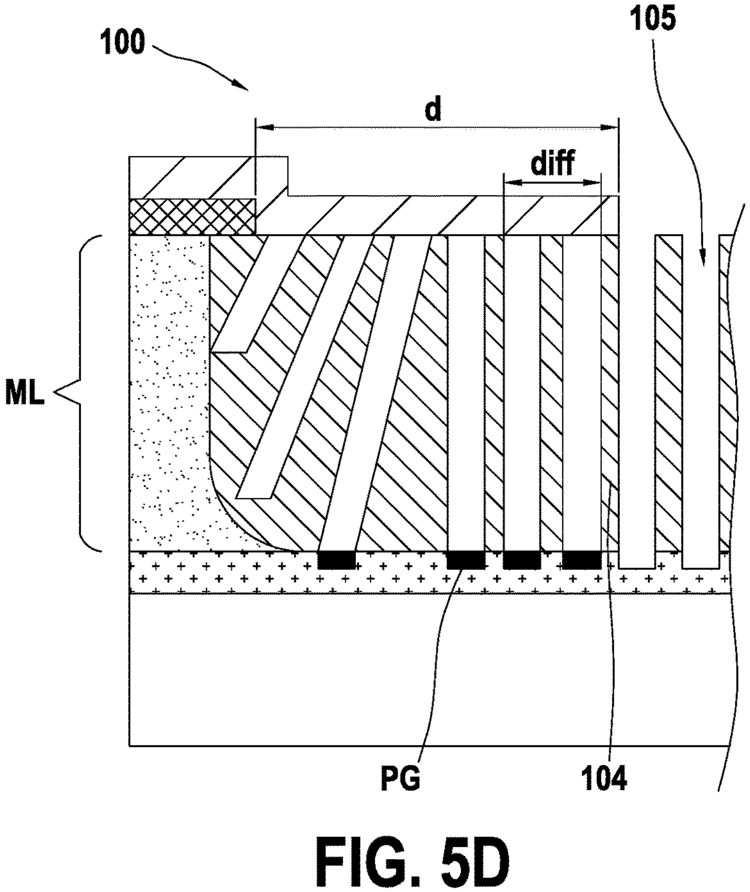

FIG. 5D is a side view of the structure of FIGS. 5A and 5B that passes through a lobe-shaped protuberance. As can be seen on the figure, there is a greater amount of pores that are plugged at their bottom end with the oxide of the material of the metal barrier layer on this structure compared to the structure of FIG. 5C.

Also, above the lobe-shaped protuberance, a planar surface is obtained. Around the edges of the anodic porous oxide region, the topology is on the other hand particularly irregular.

Figure 6:
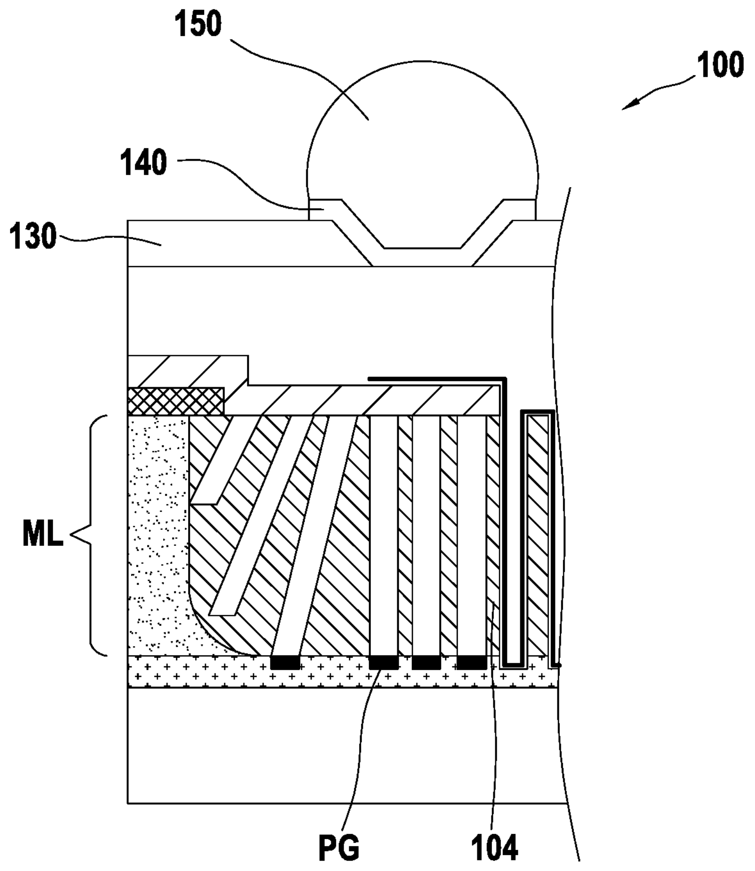
FIG. 6 is a cross section that shows a solder bump.

It has been observed that it is particularly advantageous to accommodate an under bump metallization 140 and a solder bump 150, as shown on FIG. 6, above the lobe-shaped protuberance PTB and around a passivation layer 130.

Here, the under bump metallization is formed above the above-described region 120.

This structure has been observed to lead to a better bump coplanarity between the bumps, which facilitate assembling the device on a substrate.

Also, the bumps can be electrically connected to either the top or the bottom electrode of the capacitor.

It should be noted that as an alternative to a solder bump, it is possible to implement a copper pillar which may also lead to a good planarity between pillars (not represented).

The invention claimed is:

1. An integrated device comprising:

a substrate;

a metal barrier layer above the substrate;

a layer including a porous region of an anodized metal comprising a plurality of straight pores that extend from a top surface of the porous region, perpendicularly to the top surface of the porous region, towards the metal barrier layer so as to reach the metal barrier layer, wherein the porous region comprises a zone of pores that open onto the metal barrier layer surrounded by peripheral pores that are plugged up at bottom ends by an oxide plug of the metal barrier layer, the porous region further comprising at least one of:

- an island of pores plugged up at the bottom ends by the oxide plug of the metal barrier layer surrounded by pores of the zone of pores that open onto the metal barrier layer, and
- a protuberance of pores plugged up at the bottom ends by an oxide plug of the metal barrier layer, the protuberance extending from the peripheral pores towards the inside of the zone of pores that open onto the metal barrier layer.

2. The integrated device of claim 1, wherein pores that are plugged up at the bottom ends are covered by an etching mask having an opening above the zone of pores that open onto the metal barrier layer.

3. The integrated device of claim 2, wherein the etching mask includes, at the periphery of the opening, at least one etching mask protuberance in the direction of the inside of the opening, the etching mask protuberance mask covering the protuberance of pores that are plugged up at the bottom ends.

4. The integrated device of claim 3, comprising a plurality said protuberances of pores, and wherein a group of protuberances of the plurality of said protuberances are evenly spaced.

5. The integrated device of claim 3, wherein the at least one etching mask protuberance is lobe-shaped.

6. The integrated device of claim 3, wherein the at least one etching mask protuberance extends from an edge of the zone of pores that open onto the metal barrier layer over a distance of 50 μm towards the inside of the opening.

7. The integrated device of claim 3, further comprising, above the at least one etching mask protuberance, a copper pillar or a solder bump.

8. The integrated device of claim 1, further comprising a stacked capacitive structure including a bottom electrode layer, a dielectric layer, and a top electrode layer inside pores of the porous region.

9. The integrated device of claim 1, wherein the porous region comprises an island of pores plugged up at the bottom ends by the oxide plug of the metal barrier layer surrounded by pores of the zone of pores that open onto the metal barrier layer, covered by an etching mask island.

10. The integrated device of claim 1, wherein the porous region comprises a plurality of islands of pores plugged up at the bottom ends by the oxide plug of the metal barrier layer surrounded by pores of the zone of pores that open onto the metal barrier layer.

11. The integrated device of claim 10, wherein the etching mask island is a round island.

12. The integrated device of claim 11, further comprising, above the round island, a copper pillar or a solder bump.

13. The integrated device of claim 1, wherein the porous region further comprises a bridge of pores plugged up at the bottom ends by the oxide plug of the metal barrier layer, the bridge joining two edges of the porous region and separating the zone of pores that open onto the metal barrier layer into two sub-zones.

14. A method of manufacturing an integrated device, the method comprising:

forming a metal barrier layer above a substrate;

forming an anodizable metal layer on the metal barrier layer;

anodizing a region of the anodizable metal layer to obtain a porous region of an anodized metal comprising a plurality of straight pores that extend from a top surface of the porous region, perpendicularly to the top surface of the porous region, towards the metal barrier layer;

forming an etching mask having an opening above the porous region;

etching bottom ends of pores of the porous region through the opening of the etching mask, so that after etching, the porous region comprises a zone of pores that open onto the metal barrier layer surrounded by peripheral pores that are plugged up at the bottom ends by an oxide plug of the metal barrier layer, the porous region further comprising at least one of:

an island of pores plugged up at the bottom ends by the oxide plug of the metal barrier layer surrounded by pores of the zone of pores that open onto the metal barrier layer, and a protuberance of pores plugged up at the bottom ends by the oxide plug of the metal barrier layer, the protuberance extending from the peripheral pores towards inside of the zone of pores that open onto the metal barrier layer.

* * * * *